(12) United States Patent
Chen et al.

(10) Patent No.: US 8,089,118 B2
(45) Date of Patent: Jan. 3, 2012

(54) METHOD FOR SELECTIVE GATE HALO IMPLANTATION IN A SEMICONDUCTOR DIE AND RELATED STRUCTURE

(75) Inventors: Xiangdong Chen, Irvine, CA (US); Henry Kuo-Shun Chen, Irvine, CA (US); Kent Charles Oertle, Phoenix, AZ (US); Jennifer Chiao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 41 days.

(21) Appl. No.: 12/456,065

(22) Filed: Jun. 10, 2009

(65) Prior Publication Data
US 2010/0314691 A1    Dec. 16, 2010

(51) Int. Cl.
*H01L 29/788*   (2006.01)
*H01L 29/792*   (2006.01)
*H01L 29/76*    (2006.01)
*H01L 29/94*    (2006.01)
*H01L 31/062*   (2006.01)

(52) U.S. Cl. ......... 257/316; 257/347; 257/344; 257/324

(58) Field of Classification Search ................ 257/335, 257/316, 347, 344, 324, 392, 142, 148, 285, 257/607, 608, 609–612, 408, 549, 550, 387, 369

See application file for complete search history.

(56) References Cited

U.S. PATENT DOCUMENTS

| 6,458,665 B1 * | 10/2002 | Kim ............................... 438/302 |
| 2009/0146220 A1 * | 6/2009 | Yoo et al. ...................... 257/392 |

* cited by examiner

*Primary Examiner* — Chuong A. Luu
(74) *Attorney, Agent, or Firm* — Farjami & Farjami LLP

(57) ABSTRACT

According to one embodiment, a method for selective gate halo implantation includes forming at least one gate having a first orientation and at least one gate having a second orientation over a substrate. The method further includes performing a halo implant over the substrate. The first orientation allows a halo implanted area to be formed under the at least one gate having the first orientation and the second orientation prevents a halo implanted area from forming under the at least one gate having the second orientation. The halo implant is performed without forming a mask over the at least one gate having the first orientation or the at least one gate having the second orientation. The at least one gate having the first orientation can be used in a low voltage region of a substrate, while the at least one gate having the second orientation can be used in a high voltage region.

20 Claims, 5 Drawing Sheets

US 8,089,118 B2

METHOD FOR SELECTIVE GATE HALO IMPLANTATION IN A SEMICONDUCTOR DIE AND RELATED STRUCTURE

BACKGROUND OF THE INVENTION

1. Field of the Invention

The present invention is generally in the field of semiconductors. More particularly, the invention is in the field of semiconductor transistor fabrication.

2. Background Art

A semiconductor die (also referred to as a "chip" or simply as a "die" in the present application) can include multiple input/output (I/O) and core regions, where each region can include transistors that require a different operating voltage. For example, the semiconductor die can include an I/O section that requires 3.3 volt transistors, another I/O section that requires 5.0 volt transistors, and a core section that requires 1.8 volt transistors. As transistor channel length is scaled down in advanced technologies, halo implants are typically utilized to prevent the occurrence of undesirable short-channel effects, such as punchthrough. Although halo implants can be effective for low voltage transistors having short channel lengths, halo implants can cause hot carrier degradation, which can significantly increase in high voltage transistors.

To reduce hot carrier degradation, a conventional approach can include increasing the channel length of transistors in regions of the semiconductor die that operate at higher voltages, such as I/O regions that require operating voltages of, for example, 3.3 volts or higher. However, increased channel length can undesirably reduce transistor performance. In another conventional approach, hot carrier degradation can be prevented or reduced by utilizing circuit-related techniques, such as stacking lower voltage transistors in high voltage regions, to ensure that a specified voltage is not exceeded across any transistor junction. However, the aforementioned circuit-related techniques can undesirably increase die size and reduce transistor performance.

SUMMARY OF THE INVENTION

A method for selective gate halo implantation in a semiconductor die and related structure are provided. Features, advantages and various embodiments of the present invention are shown in and/or described in connection with at least one of the drawings, as set forth more completely in the claims.

DETAILED DESCRIPTION OF THE INVENTION

The present invention is directed to a method for selective gate halo implantation in a semiconductor die and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
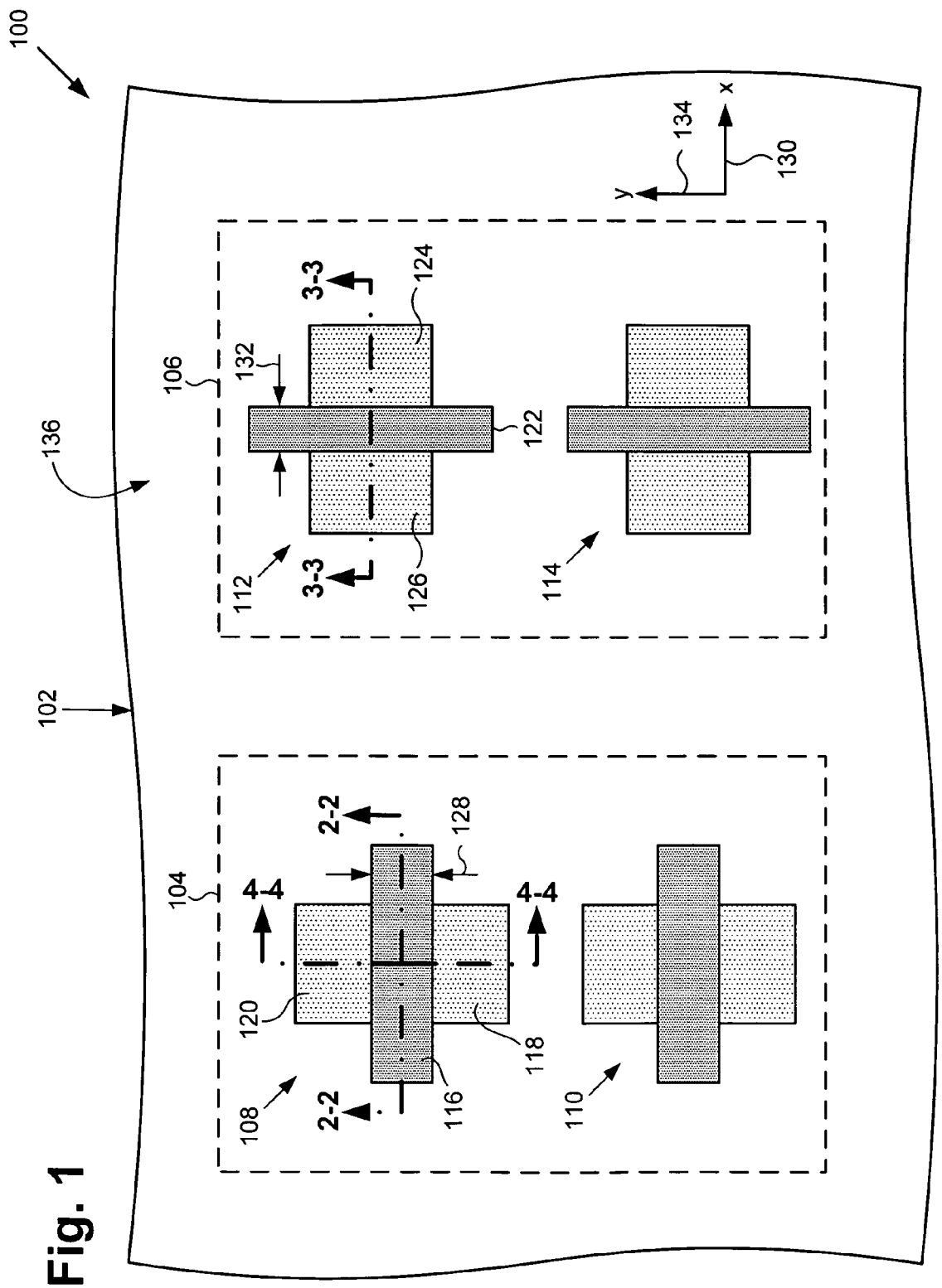
FIG. 1 illustrates a top view of an exemplary structure including exemplary transistor gates having different orientations in different regions of a substrate in accordance with one embodiment of the present invention.

FIG. 1 shows a top view of exemplary structure including exemplary transistor gates having different orientations in different regions of a substrate in accordance with one embodiment of the present invention. In FIG. 1, structure 100, which can be a portion of a semiconductor die, includes substrate 102 (e.g. a silicon substrate) including regions 104 and 106. Region 104 includes transistor 108 and 110 and region 106 includes transistors 112 and 114, where transistors 108, 110, 112, and 114 can each be a field effect transistor (FET). Each of transistors 108 and 110 include gate 116, drain 118, and source 120 and each of transistors 112 and 114 include gate 122, drain 124, and source 126. Each of transistors 108, 110, 112, and 114 can also include spacers and a gate dielectric, which are not shown in FIG. 1. Region 104 of substrate 102 includes gates having an orientation that prevents formation of underlying halo implanted areas and region 106 of substrate 102 includes gates having an orientation that allows formation of underlying halo implanted areas.

In an embodiment of the invention, region 104 can be high voltage region of substrate 102 and region 106 can be a low voltage region of substrate 102. Thus, for example, transistors 108 and 110 can be high voltage transistors and transistors 112 and 114 can be low voltage transistors. In an embodiment, region 104 of substrate 102 can have an operating voltage of, for example, at least approximately 3.3 volts. Region 106 can have an operating voltage of, for example, approximately 2.5 volts or less in an embodiment of the invention. Regions 104 and 106 can each be, for example, an I/O region or a core region of substrate 102. For example, region 104 can be a high voltage I/O region and region 106 can be a low voltage core or I/O region of substrate 102.

As shown in FIG. 1, gate 116 is situated over substrate 102 and source 120 and drain 118 are situated adjacent to gate 116 in substrate 102. Gate 116 can comprise polycrystalline silicon (polysilicon) or other conductive material and can be formed in a manner known in the art. A gate dielectric (not shown in FIG. 1) can be situated between gate 116 and substrate 102. Transistor 108 includes a channel (not shown in FIG. 1) underlying gate 116 and extending between source 120 and drain 118. The channel underlying gate 116 has channel length 128 (i.e. the separation distance between source 120 and drain 118). In an embodiment of the invention, transistors 108 and 110 can have a minimum design rule channel length equal to approximately 0.4 microns. In an embodiment of the invention, transistors 108 and 110 can have a channel length greater than approximately 0.4 microns.

Gate 116 can be formed so as to have an orientation that is substantially parallel with the x-direction (i.e. the direction indicated by x-axis 130). In other words, the longer dimension of gate 116 (corresponding to the channel width) extends in a direction substantially parallel to x-axis 130. In region 104 of substrate 102, the orientation of gate 116 can be selected so as to prevent a halo implanted area from forming under gate 116 during a halo implant, which can be concurrently performed over regions 104 and 106 of substrate 102.

Also shown in FIG. 1, gate 122 is situated over substrate 102 and source 126 and drain 124 are situated adjacent to gate 122 in substrate 102. Gate 122 can comprise polysilicon or other conductive material and can be formed in a manner known in the art. A gate dielectric (not shown in FIG. 1) can be situated between gate 122 and substrate 102. Transistor 112 includes a channel (not shown in FIG. 1) underlying gate 122 and extending between source 126 and drain 124. The channel underlying gate 122 has channel length 132 (i.e. the separation distance between source 126 and drain 124). In an embodiment of the invention, transistors 112 and 114 can have a minimum design rule channel length equal to approximately 0.28 microns. In an embodiment of the invention, transistors 112 and 114 can have a channel length of between approximately 0.28 microns and approximately 0.4 microns. In an embodiment of the invention, transistors 112 and 114 can have a channel length that is less than approximately 0.4 microns. In an embodiment of the invention, transistors 112 and 114 in region 106 can have a channel length that is less than the channel length of transistors 108 and 110 in region 104.

Gate 122 can be formed so as to have an orientation that is substantially parallel with the y-direction (i.e. the direction indicated by y-axis 134). In other words, the longer dimension of gate 122 (corresponding to the channel width) extends in a direction substantially parallel to y-axis 134. In region 106 of substrate 102, the orientation of gate 122 can be selected so as to allow a halo implanted area (not shown in FIG. 1) to form under gate 122 during a halo implant, which can be concurrently performed over regions 104 and 106 of substrate 102.

During a halo implantation process, the halo implant can be performed over regions 104 and 106 of substrate 102 at an angle of approximately 0.0 degrees with respect to x-axis 130 and at an angle of approximately 180.0 degrees with respect to x-axis 130. The halo implant can also be performed at a tilt angle of between approximately 5.0 degrees and approximately 50.0 degrees with respect to a z-axis (not shown in FIG. 1), which extends in a direction substantially perpendicular to top surface 136 of substrate 102. As a result of the orientation of gate 116, which is orientated substantially parallel with x-axis 130, gate 116 can block the halo implant, thereby preventing a halo implanted area from forming under gate 116. In contrast to gate 116, gate 122 in region 106 of substrate 102 is orientated substantially parallel with y-axis 134 (i.e. the orientation of gate 122 is substantially perpendicular to the orientation of gate 118). As a result of the orientation of gate 122, a halo implanted area (not shown in FIG. 1) can be formed under gate 122.

As channel length is scaled down, a halo implant can be utilized to prevent the occurrence of undesirable short-channel effects, such as punchthrough, by forming halo implanted areas under the gate. However, the respective junctions formed between the halo implanted areas and the source and drain can cause hot carrier degradation, wherein, for example, the gate dielectric can be degraded by injection of hot carriers from the channel. Hot carrier degradation can increase significantly at a high operating voltage, such as an operating voltage of, for example, approximately 3.3 volts. Thus, in region 104 of substrate 102, which can have a high operating voltage, gate 116 can be orientated so as to prevent formation of an underlying halo implanted area during a halo implant process. In region 106 of substrate 102, which can have a low operating voltage and a short channel length, gate 122 can be orientated so as to allow formation of an underlying halo implant region during the halo implant process.

Thus, through selective gate orientation, transistors 108 and 110 can be optimized in region 104, such as a high operating voltage region of substrate 102, by blocking a halo implant and, thereby, preventing or significantly reducing hot carrier degradation. In region 106, which can have a low operating voltage and a short channel length, selective gate orientation can be utilized to optimize transistors 112 and 114 by allowing the formation of halo implanted areas so as to prevent short-channel effects, such as punchthrough. Also, by utilizing selective gate orientation, an embodiment of the invention can allow halo implanted areas to be formed in region 106 of substrate 102 and can prevent the formation of halo implanted areas in region 104 of substrate 102 without requiring an additional mask. As a result, the present invention can advantageously avoid additional process steps and cost associated with the additional mask.

Figure 2:
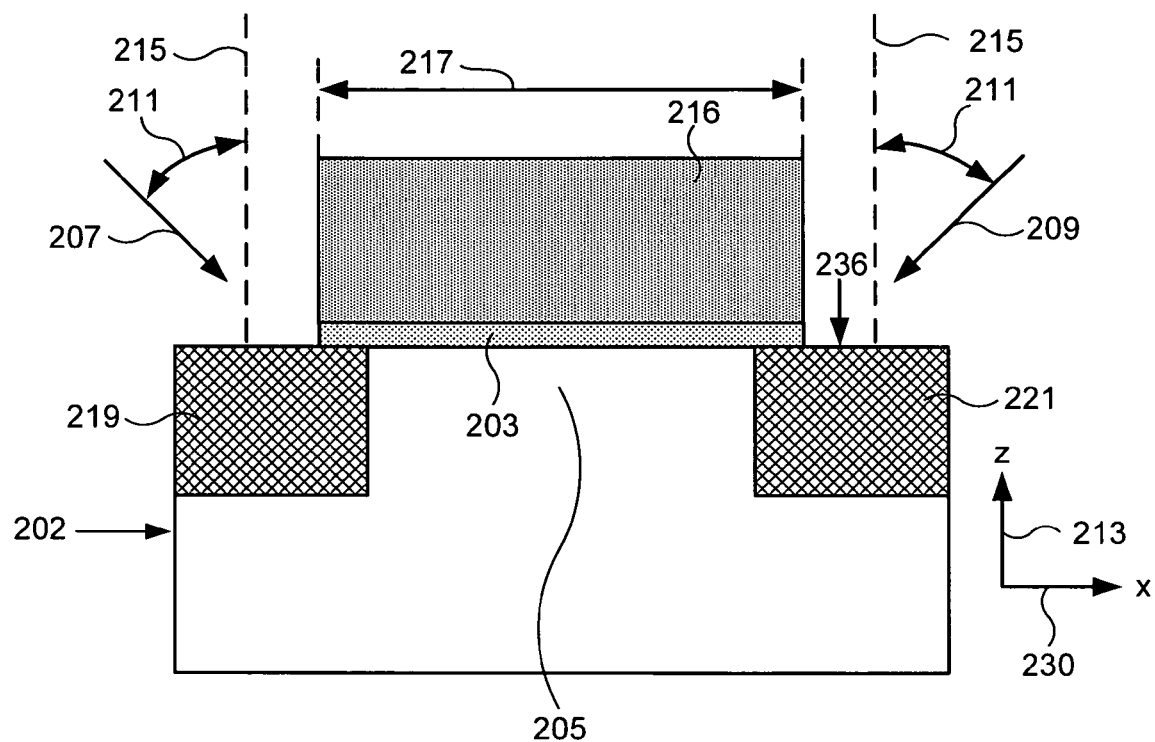
FIG. 2 illustrates an enlarged cross-sectional view of a portion of the structure of FIG. 1 during a halo implant process.

FIG. 2 shows an enlarged cross-sectional view of structure 100 along line 2-2 during a halo implant process. In FIG. 2, substrate 202, gate 216, x-axis 230, and top surface 236 correspond, respectively, to substrate 102, gate 116, x-axis 130, and top surface 136 in FIG. 1. As shown in FIG. 2, gate dielectric 203 is situated over channel 205 of substrate 202 and gate 216 is situated over gate dielectric 203. Gate dielectric 203 can comprise silicon oxide or other suitable gate dielectric material and can be formed over substrate 202 in a manner known in the art. As further shown in FIG. 2, isolation regions 219 and 221 are situated in substrate 205 adjacent to opposing sides of gate 216. Isolation regions 219 and 221, which are not shown in FIG. 1, can be, for example, shallow trench isolation (STI) regions.

As also shown in FIG. 2, a halo implant (indicated by arrows 207 and 209) is performed over substrate 202. The halo implant can be performed at an angle of approximately 0.0 degrees with respect to x-axis 230 (as indicated by arrow 207) and at an angle of approximately 180.0 degrees with respect to x-axis 230 (as indicated by arrow 209). The halo implant can also be performed at tilt angle 211, which is formed with respect to z-axis 213 (as indicated by dashed line 215, which extends substantially perpendicular to top surface 236 of substrate 202). Tile angle 211 can be, for example, between approximately 5.0 degrees and approximately 50.0 degrees. As further shown in FIG. 2, gate 216 is orientated substantially parallel with x-axis 230. In other words, longer dimension 217 of gate 216 (corresponding to channel width) extends in a direction substantially parallel to x-axis 230. As shown in FIG. 2, the orientation of gate 216 prevents the halo implant from forming a halo implanted area in channel 205 underlying gate 216.

Figure 3:
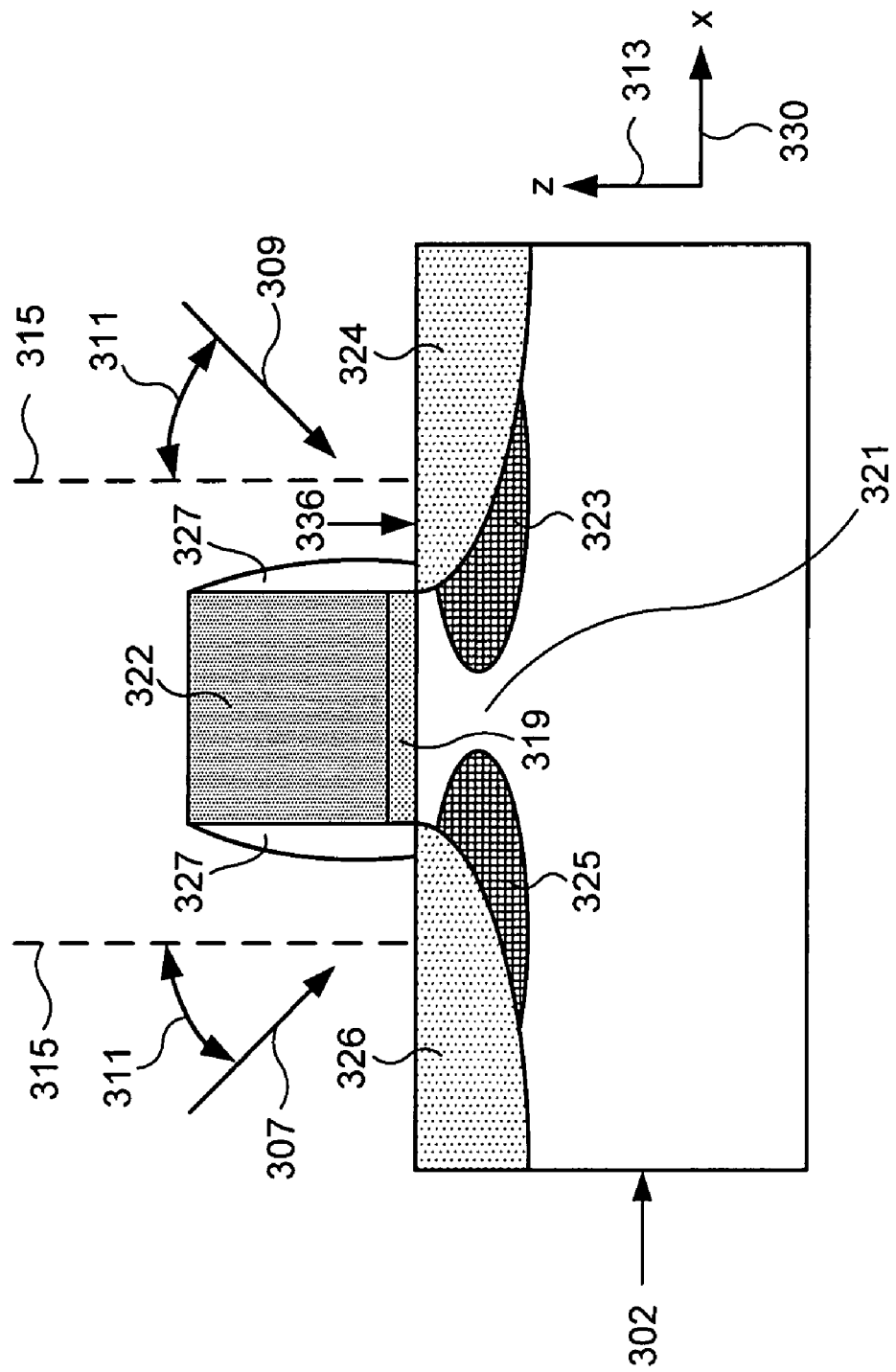
FIG. 3 illustrates an enlarged cross-sectional view of another portion of the structure of FIG. 1 during a halo implant process.

FIG. 3 shows an enlarged cross-sectional view of structure 100 along line 3-3 during a halo implant process. In FIG. 3, substrate 302, gate 322, x-axis 330, drain 324, source 326, and top surface 336 correspond, respectively, to substrate 102, gate 122, x-axis 130, drain 124, source 126, and top surface 136 in FIG. 1. Also, arrows 307 and 309, tilt angle 311, z-axis 313, dashed line 315 in FIG. 3 correspond, respectively, to arrows 207 and 209, tilt angle 211, z-axis 213, dashed line 215 in FIG. 2. As shown in FIG. 3, gate dielectric 319 is situated over channel 321 of substrate 302 and gate 322 is situated over gate dielectric 317. Gate dielectric 319 can comprise silicon oxide or other dielectric material and can be formed over substrate 302 in a manner known in the art.

As also shown in FIG. 3, spacers 327 are situated adjacent to opposite sides of gate 322. Spacers 327 can comprise silicon oxide or other suitable spacer material and can be formed in a manner known in the art. As further shown in FIG.

3, drain 324 and source 326 are situated in substrate 302 adjacent to gate 322, halo implanted area 323 is situated in channel 321 adjacent to drain 324, and halo implanted area 325 is situated in channel 321 adjacent to source 326. Halo implanted areas 323 and 325 can have an opposite conductivity type compared drain 324 and source 326. Halo implanted areas 323 and 325 can have P type conductivity and drain 324 and source 326 can have N type conductivity, or vice versa. Halo implanted areas 323 and 325 can be formed by a halo implant (indicated by arrows 307 and 309), which can be performed over substrate 302. In one embodiment, the halo implant can be performed prior to formation of spacers 327.

The halo implant can be performed at an angle of approximately 0.0 degrees with respect to x-axis 330 (as indicated by arrow 307) and at an angle of approximately 180.0 degrees with respect to x-axis 330 (as indicated by arrow 309). The halo implant can also be performed at tilt angle 311, which is formed with respect to z-axis 313 (as indicated by dashed line 315, which extends substantially perpendicular to top surface 336 of substrate 302). Gate 322 has the same orientation as gate 122, which is orientated substantially parallel with the y-direction, as indicated by y-axis 134 in FIG. 1. Thus, as a result of the orientation of gate 322, the halo implant can form halo implanted areas 323 and 325 under gate 322.

Figure 4:
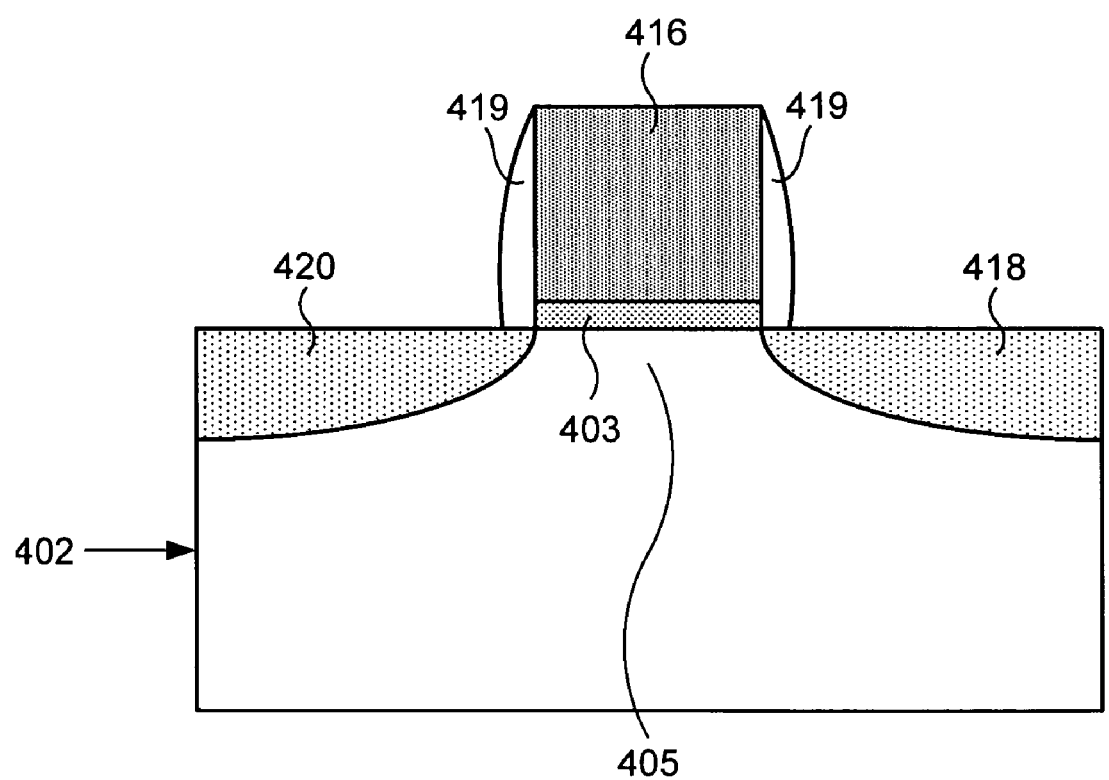
FIG. 4 illustrates an enlarged cross-sectional view of a portion of the structure of FIG. 1 after completion of a halo implant process.

FIG. 4 shows an enlarged cross-sectional view of structure 100 along line 4-4 after a halo implant process has been performed. In FIG. 4, substrate 402, gate 416, and drain 418 correspond, respectively, to substrate 102, gate 116, and drain 118 in FIG. 1. Also, gate dielectric 403, channel 405, and gate 416 in FIG. 4 correspond, respectively, to gate dielectric 203, channel 205, and gate 216 in FIG. 2. As shown in FIG. 4, gate dielectric 403 is situated over channel 405 of substrate 402, gate 416 is situated over gate dielectric 403, and spacers 419 are situated adjacent to opposite sides of gate 416. Spacers 419 are substantially similar in composition and formation to spacers 321 in FIG. 3. Further shown in FIG. 4, drain 418 and source 420 are situated in substrate 402 adjacent to gate 416. Gate 416 has the same orientation of gate 216, is orientated substantially parallel with x-axis 230 in FIG. 2. Thus, as a result of the orientation of gate 416, a halo implanted area is not formed adjacent to drain 418 or source 420 in channel 405.

Figure 5:
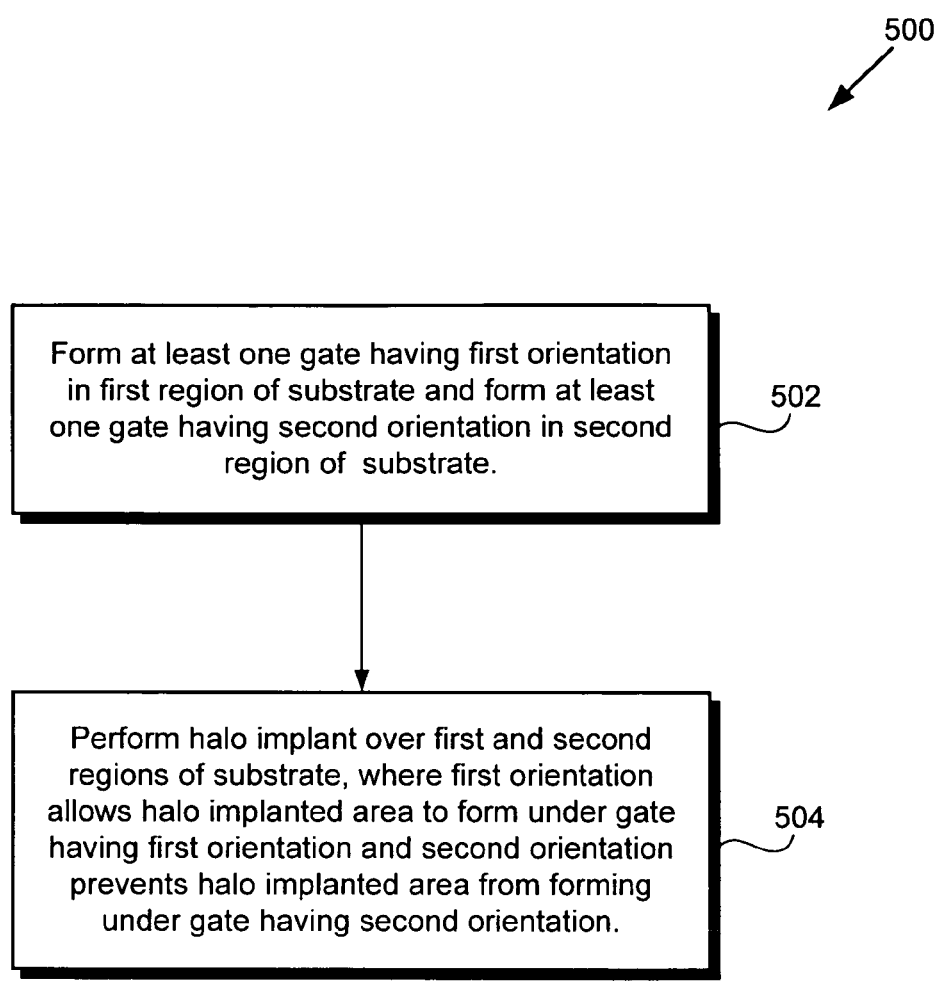
FIG. 5 shows a flowchart illustrating an exemplary method for selective gate halo implantation in accordance with one embodiment of the present invention.

FIG. 5 shows a flowchart illustrating an exemplary method for selective gate halo implantation according to one embodiment of the present invention. Certain details and features have been left out of flowchart 500 that are apparent to a person of ordinary skill in the art. For example, a step may consist of one or more substeps or may involve specialized equipment, as known in the art.

At step 502 of flowchart 500, at least one gate having a first orientation (e.g. gate 122 in FIG. 1) in a first region of a substrate (e.g. region 106 of substrate 102) and at least one gate having a second orientation (e.g. gate 116) in a second region of the substrate (e.g. region 104 of substrate 102). For example, gate 122 can have an orientation that is substantially parallel with the y-direction, which is indicated by y-axis 134 in FIG. 1. For example, gate 116 can have an orientation that is substantially parallel with the x-direction, which is indicated by x-axis 130 in FIG. 1. Thus, gate 122 can have an orientation that is substantially perpendicular to the orientation of gate 116. For example, region 106 can be a low voltage region and region 104 can be a high voltage region of substrate 102. Gate 116 can overlie a channel having a channel length that is, for example, less than approximately 0.4 microns, and gate 122 can overlie a channel having a channel length that is, for example, greater than approximately 0.4 microns. Region 106 can be, for example, an I/O region having an operating voltage equal to approximately 2.5 volts or less in an embodiment of the invention. Region 104 can be, for example, an I/O region having an operating voltage equal to at least 3.3 volts in an embodiment of the invention.

At step 504 of flowchart 500, a halo implant (indicated by arrows 207 and 209 in FIG. 2 and by arrows 307 and 309 in FIG. 3) can be performed over the first and second regions of the substrate. The first orientation (e.g. the orientation of gate 322 in FIG. 3) allows a halo implanted area (e.g. halo implanted areas 323 and 325) to be formed under the gate having the first orientation (e.g. gate 322) and the second orientation (e.g. the orientation of gate 216 in FIG. 2) prevents a halo implanted area from forming under the gate having the second orientation (e.g. gate 216). For example, the halo implant can be performed over regions 104 and 106 of substrate 102 at an angle of approximately 0.0 degrees with respect to x-axis 130 and at an angle of approximately 180.0 degrees with respect to x-axis 130 in FIG. 1. The halo implant can also be performed, for example, at a tilt angle of between approximately 5.0 degrees and approximately 50.0 degrees with respect to a z-axis, which can extend in a direction substantially perpendicular to top surface 136 of substrate 102 in FIG. 1.

Thus, as discussed above, by selectively orientating gates in different regions of a substrate, the present invention can allow halo implanted areas to form under gates in one region of the substrate, such as a low voltage region, while preventing halo implanted areas to form under gates in another region of the substrate, such as a high voltage region. By selective gate orientation, an embodiment of the invention can optimize transistors in a high voltage region of the substrate by blocking a halo implant so as to prevent or significantly reduce hot carrier degradation, and can optimize transistors having a short channel length in a low voltage region of the substrate by allowing formation of halo implanted areas so as to prevent undesirable short-channel effects, such as punch-through. Also, the present invention can provide selective gate halo implantation without requiring an additional mask, thereby advantageously avoiding additional process steps and cost associated with the additional mask.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:
1. A semiconductor die comprising:
at least one transistor having a gate with a first orientation and a first operating voltage, and at least one transistor having a gate with a second orientation and a second operating voltage, situated over a substrate;
a first halo implanted area underlying said gate with said first orientation;
said second orientation having prevented a second halo implanted area from underlying said gate with said second orientation;

wherein said first operating voltage is different than said second operating voltage.

2. The semiconductor die of claim 1, wherein said first orientation is substantially perpendicular to said second orientation.

3. The semiconductor die of claim 1, wherein said first operating voltage is lower than said second operating voltage.

4. The semiconductor die of claim 3, wherein said first operating voltage is not greater than approximately 2.5 volts.

5. The semiconductor die of claim 3, wherein said second operating voltage is at least approximately 3.3 volts.

6. The semiconductor die of claim 1, wherein a channel underlying said gate with said first orientation has a first channel length and a channel underlying said gate with said second orientation has a second channel length, wherein said first channel length is smaller than said second channel length.

7. The semiconductor die of claim 6, wherein said first channel length is between approximately 0.28 microns and approximately 0.4 microns.

8. The semiconductor die of claim 6, wherein said second channel length is greater than approximately 0.4 microns.

9. The semiconductor die of claim 1, wherein said at least one transistor having said gate with said first orientation is situated in a first input/output region of said substrate and said at least one transistor having said gate with said second orientation is situated in a second input/output region of said substrate.

10. The semiconductor die of claim 1, wherein said at least one transistor having said gate with said first orientation is situated in a core region of said substrate and said at least one transistor having said gate with said second orientation is situated in an input/output region of said substrate.

11. A semiconductor die comprising:
a semiconductor substrate including a low voltage region and a high voltage region;
a transistor having a gate with a first orientation in said low voltage region;
another transistor having another gate with a second orientation in said high voltage region;
a halo implant formed under said gate by a halo implantation over said semiconductor substrate;
said second orientation preventing formation of another halo implant under said another gate during said halo implantation.

12. The semiconductor die of claim 11, wherein said first orientation is substantially perpendicular to said second orientation.

13. The semiconductor die of claim 11, wherein said transistor comprises a field effect transistor (FET) including source/drain regions having a first conductivity type, and wherein said halo implant has a second conductivity type opposite said first conductivity type.

14. The semiconductor die of claim 11, wherein said transistor having said gate with said first orientation has an operating voltage less than or equal to approximately 2.5 volts.

15. The semiconductor die of claim 11, wherein said another transistor having said another gate with said second orientation has an operating voltage greater than or equal to approximately 3.3 volts.

16. The semiconductor die of claim 11, wherein a channel underlying said gate with said first orientation has a first channel length and another channel underlying said another gate with said second orientation has a second channel length, wherein said first channel length is smaller than said second channel length.

17. The semiconductor die of claim 16, wherein said first channel length is between approximately 0.28 microns and approximately 0.4 microns.

18. The semiconductor die of claim 16, wherein said second channel length is greater than approximately 0.4 microns.

19. The semiconductor die of claim 11, wherein said low voltage region comprises a first input/output region of said semiconductor substrate and said high voltage region comprises a second input/output region of said semiconductor substrate.

20. The semiconductor die of claim 11, wherein said low voltage region comprises a core region of said semiconductor substrate and said high voltage region comprises an input/output region of said semiconductor substrate.

* * * * *